United States Patent [19]

Sugiura et al.

[11] Patent Number: 5,045,732
[45] Date of Patent: Sep. 3, 1991

[54] POLYGON CIRCUIT

[75] Inventors: Hiroaki Sugiura; Hiroyuki Takenaga, both of Nagaokakyo, Japan

[73] Assignee: Mitsubishi Denki Kabushiki Kaisha, Tokyo, Japan

[21] Appl. No.: 493,829

[22] Filed: Feb. 27, 1990

[30] Foreign Application Priority Data

Mar. 2, 1989 [JP] Japan .................................. 1-51502
Sep. 21, 1989 [JP] Japan .................................. 1-247478

[51] Int. Cl.$^5$ ..................... H03K 5/153; H03B 19/00
[52] U.S. Cl. .................................. 307/529; 307/360; 307/361; 307/263
[58] Field of Search ............... 307/529, 359, 360, 361, 307/263; 328/185, 187; 333/14

[56] References Cited

U.S. PATENT DOCUMENTS 3,997,845 12/1976 Wegstedt ........................... 307/361
3,999,084 12/1976 Beaudette ........................... 307/360
4,529,893 7/1985 Nagano ............................... 307/361

FOREIGN PATENT DOCUMENTS 59-67784 4/1984 Japan .

Primary Examiner—Timothy P. Callahan

[57] ABSTRACT

In a polygon circuit for input signal level compression in a signal processing circuit in, for example, a color television camera or the like, a first current proportional to the difference between an input signal voltage Vin and a reference voltage Vref is provided, and a clip circuit clips the input signal voltage Vin at a break-point setting voltage Va. A second current proportional to the difference between the output voltage of the clip circuit and the break-point setting voltage is produced, and addition or subtraction is performed on the first current and the second current to output a voltage signal proportional to the sum or the difference.

2 Claims, 5 Drawing Sheets

POLYGON CIRCUIT

FIELD OF THE INVENTION

BACKGROUND OF THE INVENTION

This invention relates to a polygon circuit used for input signal level compression in a signal processing circuit in, for example, a color television camera or the like.

DESCRIPTION OF THE BACKGROUND ART

FIG. 1 is a diagram showing a prior art polygon circuit. In the FIG. Q21 to Q28 denote transistors, and R21 to R32 denote resistors. Q23 and R24; Q24 and R25; and Q27 and R26 respectively form current sources permitting a constant current to flow in accordance with a current source current setting voltage Vb applied to an input terminal 23. To simplify the explanation, it is assumed that R24, R25 and R26 have the same value, and the same collector current I0 flows through Q23, Q24 and Q27. Reference numeral 20 denotes an input terminal for an input signal Vin, 21 denotes an input terminal for a reference signal Vref, 22 denotes an input terminal for a break-point setting voltage Va, 23 denotes an input terminal for a current source current setting voltage Vb, 24 denotes an output terminal for an output signal Vout, and Vcc denotes a power supply voltage.

Now the operation will be described.

First, it is assumed that the collector voltage VCQ22 satisfies VCQ22 < Va.

In this case, Q26 operates as an emitter-follower. If the base-emitter voltage of Q26 is VBEQ26, the base voltage VEQ28 of Q28 is given by $$VBQ28 = Va - VBEQ26 \quad (1)$$

The emitter voltage VEQ28 of Q28 satisfies $$VEQ28 < VCQ22 \quad (2)$$

The base-emitter voltage VBEQ28 of Q28 is thus small given that VCQ22 < Va, and equations (1) and (2), and Q28 is turned off, and the output signal Vout is given by:

$$Vout = Vcc - I0\,R22 + \frac{R22}{R21}(Vin - Vref) \quad (3)$$

Now it is assumed that VCQ22 > Va.

In this case, Q28 operates as an emitter follower, and the output signal Vout is given by:

$$Vout = Vcc - \frac{R22(Vcc - Va)}{R22 + R23} - \frac{R22\,R23}{R22 + R23}I0 + \frac{R22\,R23(Vin - Vref)}{(R22 + R23)R21} \quad (4)$$

FIG. 2 is a diagram showing the input/output characteristics of the prior art polygon circuit. The gradient G in the region VCQ22 < Va, i.e., in the region $$Vin < \frac{R21}{R22}(Va - Vcc) + R21\,I0 + Vref$$

is given by:

$$R22/R21$$

The gradient G of the input/output characteristics in the region of VCQ22 > Va, i.e., in the region $$Vin > \frac{R21}{R22}(Va - Vcc) + R21\,I0 + Vref$$

is given by:

$$\frac{R22\,R23}{R21(R22 + R23)}$$

The polygon circuit is mainly implemented in a monolithic integrated circuit, and the break-point setting voltage Va is obtained by voltage-dividing the power supply voltage Vcc by use of resistors R29 and R30 disposed outside of the integrated circuit. The reference voltage Vref is a reference level for the input signal. Where a video signal is used as an input signal, the black level is input being clamped to Vref.

Vcc−I0 R22 is the reference level for the output signal Vout.

In the prior art polygon circuit constructed as described above, when the characteristics of R22, Q24 and R25 vary, the break-point set by R29 and R30 fluctuates with respect to the reference level Vref for the input signal or with respect to the reference level Vcc−I0 R22 for the output signal Vout.

SUMMARY OF THE INVENTION

This invention has been made to eliminate the above problem, and its object is to provide a polygon circuit in which fluctuation of the break-point with respect to the reference level is reduced.

The polygon circuit according to the invention is characterized in that the input signal Vin and the break-point setting voltage Va are directly compared.

In the polygon circuit according to the invention, the input signal and the break-point setting voltage are directly compared, so even if the characteristics of the circuit components and the current source current setting voltage vary, the fluctuation in the break-point in the input/output characteristics with respect to the reference level is reduced.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

The present invention will become more fully understood from the detailed description given hereinbelow and the accompanying drawings which are given by way of illustration only, and thus are not limitative of the present invention, and wherein:

DETAILED DESCRIPTION OF THE PREFERRED EMBODIMENTS

An embodiment of the invention will now be described.

Figure 3:
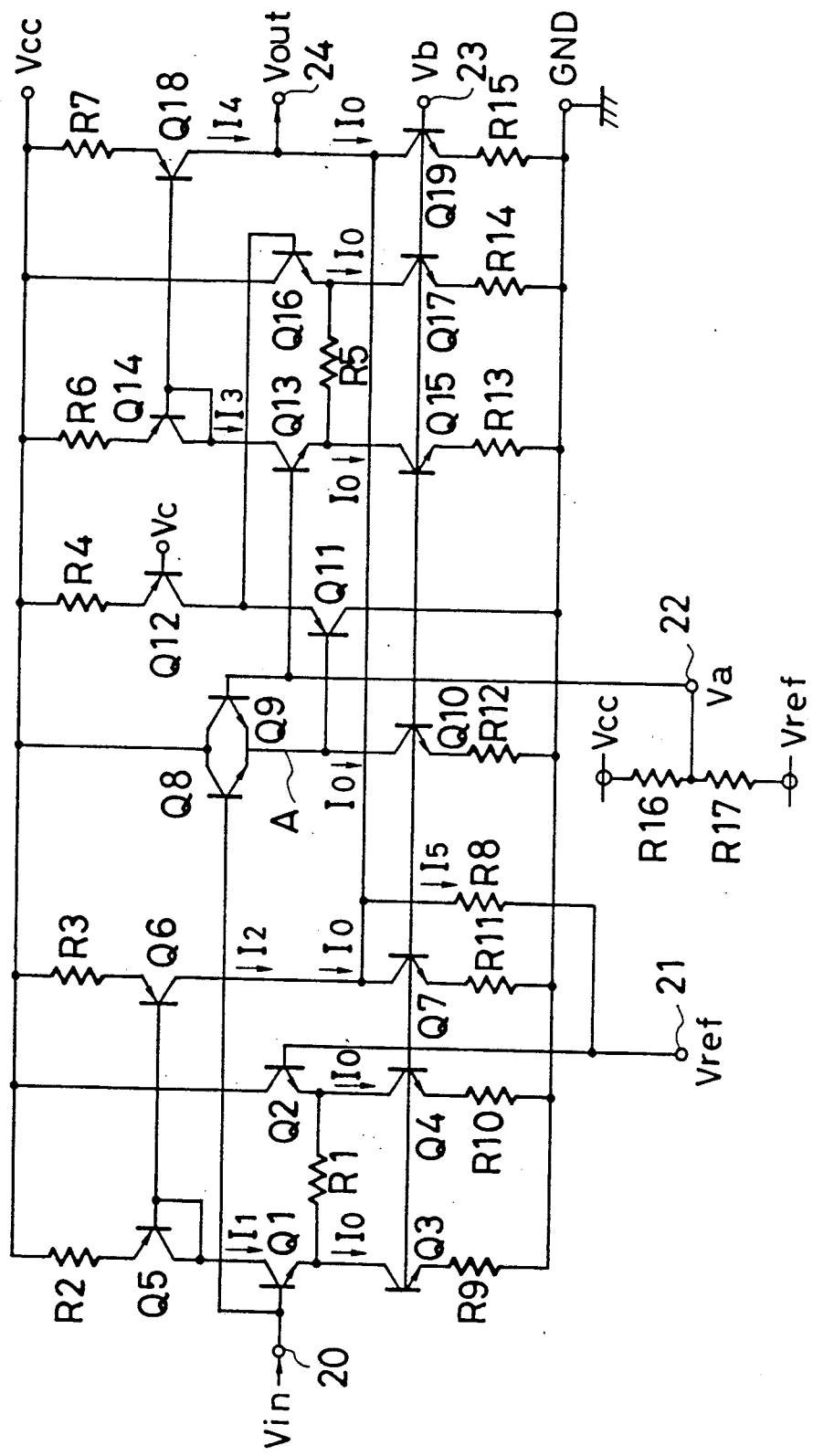
FIG. 3 is a diagram showing a polygon circuit of an embodiment of the present invention.

FIG. 3 is a circuit diagram of this embodiment. Reference marks identical to those in FIG. 1 denote identical parts, and their description is omitted. In the Figure, Q1 to Q19 denote transistors, and R1 to R7 denote resistors. Q3 and R9; Q4 and R10; Q7 and R11; Q10 and R12; Q15 and R13; Q17 and R14; and Q19 and R15 respectively form current sources which permit a constant current to flow in accordance with the current source current setting voltage Vb given at the input terminal 23. To simplify the description, it is assumed that R9, R10, R11, R12, R13, R14 and R15 have the same value, and the same collector current I0 flows through Q3, Q4, Q7, Q10, Q15, Q17 and Q19.

Q12 and R4 form a current source, and its current value is determined by the voltage Vc applied to the base of Q12.

Q5 and R2; and Q6 and R3 form a current mirror circuit, so the collector current I1 of Q5 and the collector current I2 of Q6 are given by:

$$I1 = I2 = I0 + \frac{(Vin - Vref)}{R1} \quad (5)$$

Thus, I1=I2 is a first current proportional to (Vin−Vref).

Q8 and Q9 form a clip circuit employing a pair of transistors having identical characteristics. The input signal voltage Vin and the break-point setting voltage Va are directly compared, and a voltage which equals the higher one minus the base-emitter voltage (about 0.6 V in the case of a silicon transistor) of Q8 and Q9 is output at the emitter A. Q11 operates as an emitter follower and outputs a voltage higher than the voltage input to the base plus the base-emitter voltage (about 0.6 V).

Let us consider the case in which Vin<Va.

Since the base-emitter voltages of Q9 and Q11 can be made approximately equal, Va is output at the emitter of Q11.

Now let us consider the case in which Vin>Va.

Since the base-emitter voltages of Q8 and Q11 can be made approximately equal, Vin is output at the emitter of Q11.

Q14, R6, and Q18 an R7 form a second current mirror circuit, so the collector current I3 of Q14 and the collector current I4 of Q18 are given by:

$$I3 = I4 = I0 \quad (6)$$

When Vin<Va and both base voltages of Q13 and Q16 are Va. When Vin>Va and the base voltage of Q13 is Va, and the base voltage of Q16 is Vin, $$I3 = I4 = I0 + \frac{Va - Vin}{R5} \quad (7)$$

Thus, I3 and I4 equal a second current proportional to the difference between the input voltage Vin and the break-point setting voltage Va.

If the current flowing through R8 is represented by I5, $$Vout = Vref + I5 \cdot R8 \quad (8)$$

When Vin<Va $$I5 = I2 + I4 - I0 - I0$$
$$= \frac{(Vin - Vref)}{R1}$$

so, $$Vout = Vref + \frac{R8}{R1}(Vin - Vref) \quad (9)$$

When Vin>Va $$I5 = I2 + I4 - I0 - I0 \quad (10)$$

$$Vout = Vref + \frac{R8}{R1}(Vin - Vref) + \frac{R8}{R5}(Va - Vin)$$
$$= Vref + Vin\left(\frac{R8}{R1} - \frac{R8}{R5}\right) - \frac{R8}{R1}Vref - \frac{R8}{R5}Va$$

Thus, an output voltage Vout is proportional to the sum of the first current I2 and the second current I4.

The break-point setting voltage Va is obtained by voltage-dividing the difference between Vref and the power supply voltage Vcc, by the use of resistors R16 and R17. That is, $$Va = Vref + \frac{R17}{R16 + R17}(Vcc - Vref) \quad (11)$$

Figure 4:
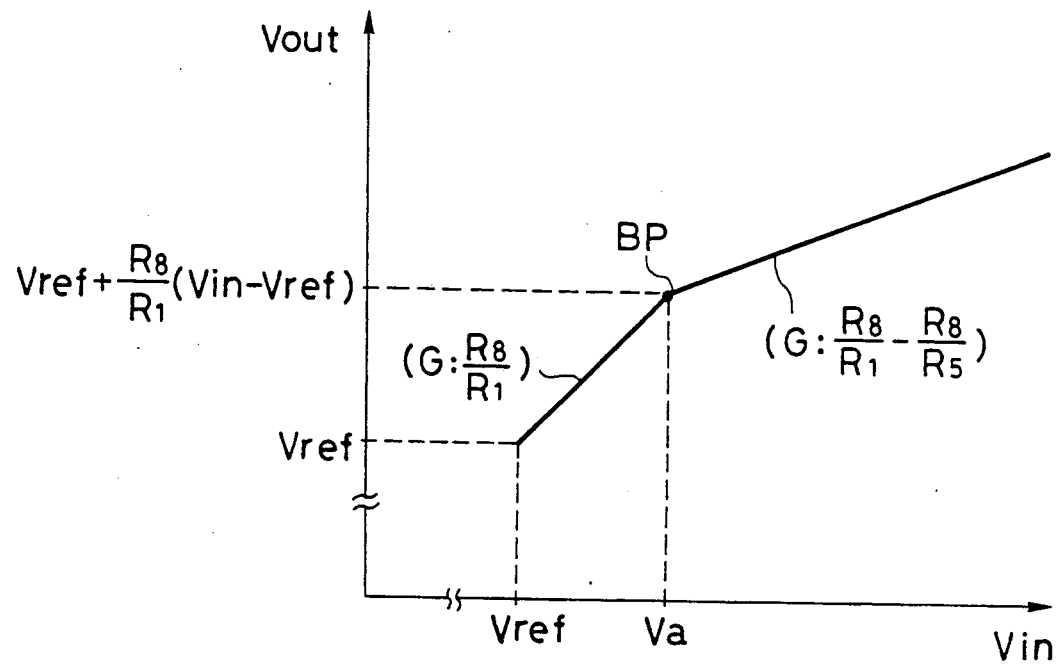
FIG. 4 is a diagram showing input/output characteristics of the polygon circuit of Fig. 3.

By the operation described above, the input/output characteristics of the embodiment shown in FIG. 3 is as shown in FIG. 4. The break-point BP of the input/output characteristics is at the point of Vout when Vin=Va, that is, from the equation (9), $$Vout = Vref + \frac{R8}{R1}(Va - Vref)$$

The gradient G of the input/output characteristics in the region of Vin<Va is

R8/R1

The gradient G of the input/output characteristics in the region of Vin>Vs

R8/R1−R8/R5

The break-point BP is determined by the break-point setting voltage Va, and the value of the output voltage Vout at the break-point BP is determined by Vref, Va, R1, and R8, so fluctuation in break-point BP is smaller than in the prior art.

Moreover, the break-point setting voltage Va is obtained by voltage-dividing the reference voltage Vref and the power supply voltage Vcc, therefore a further advantage is gained. That is, in the circuit of FIG. 3, Vref is set at a value close to Va, so fluctuation in the break-point BP due to variation in the value of R29 and R30 is reduced. Moreover, the output voltage Vout is obtained using the reference voltage Vref as a reference, thus, the reference voltage for the output voltage is the same as the reference voltage for the input signal, and coupling with the circuit of the subsequent stage is easier.

In the above embodiment, a single break-point BP is provided. But more than one break-point may be provided.

In the above embodiment, I2 and I4 are added, but subtraction between I2 and I4 may be made where the polarities of the input signal of the differential amplifier is altered due to Q13 and Q16.

As has been described, according to the above embodiment, the input signal Vin and the break-point setting voltage Va are directly compared to determine the polygon characteristic, and it is therefore possible to obtain a polygon circuit in which fluctuation in the break-point is reduced.

Figure 1:
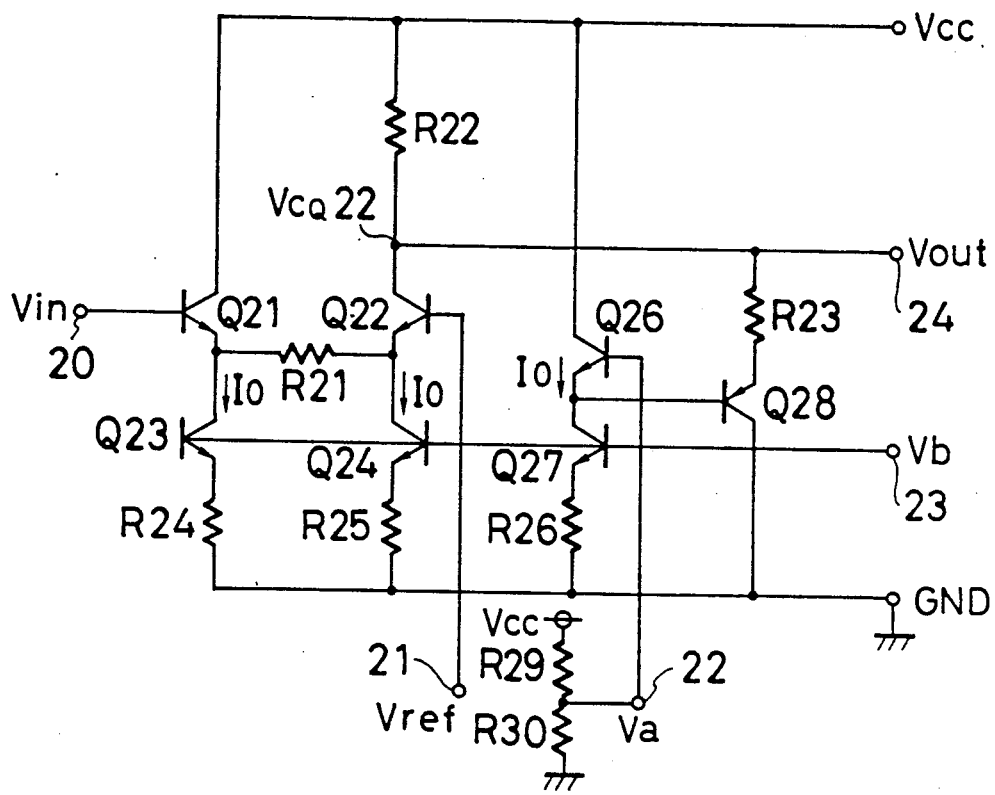
FIG. 1 is a diagram showing a polygon circuit of the prior art.
Figure 2:
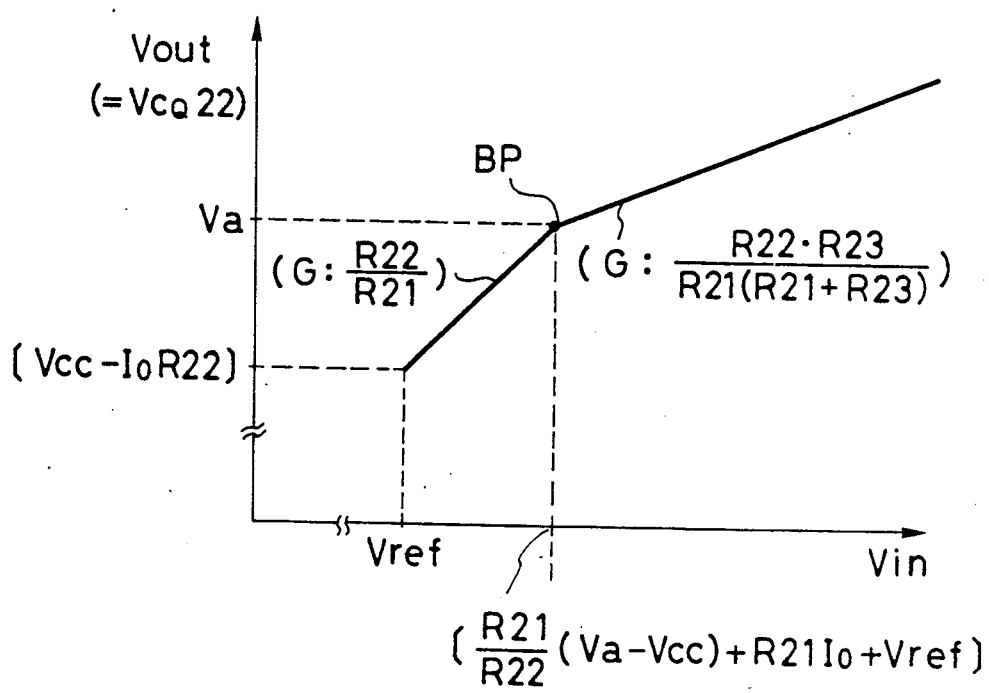
FIG. 2 is a diagram showing input/output characteristics of the polygon circuit of Fig. 1.

Another embodiment of the invention will now be described with reference to FIG. 5, in which identical reference marks as those in FIG. 1 denote identical components, and their description is omitted.

In the figure, Q101 to Q128 denote transistors, R101 to R121 denote resistors, Q101 and R101; Q102 and R102; Q103 and R103; Q104 and R104; Q105; and R105; Q106 and R106; Q107 and R107; and Q108 and R108 respectively form current sources which permit a constant current to flow in accordance with the current source current setting voltage Vb applied to an input terminal 101. To simplify the explanation, it is assumed that R101, R102, R103, R104, R105, R106, R107, and R108 have the same value and the same collector current I0 flows through Q101 to Q108.

Q109 and R109; and Q110 and R110 respectively form current sources, whose current values are determined in accordance with the current source current setting voltage Vc.

Q125 and R116, and Q126 and R117 form a first current mirror circuit, and the collector current I1 of Q125 and the collector current of I2 of Q126 are given by $$I1 = I2 = I0 + \frac{(Vref - Vin)}{R115}$$

Thus, I1=I2 is a first current proportional to (Vref−Vin).

Q111 and Q112 form a first clip circuit 51 employing a pair of transistors having identical characteristics. The input signal voltage Vin and the break-point setting voltage V1 are directly compared and a voltage which equals the level of the lower one plus the base-emitter voltage of Q111 and Q112 (about 0.6 V in the case of silicon transistor) is output to the common emitter A.

Q113 operates as an emitter follower and outputs a voltage which equals the voltage input to the base minus the base-emitter voltage (about 0.6 V) at the emitter.

The operation of Q111, Q112 and Q113 in the case of Vin>V1, and in the case of Vin<V1 will now be described.

(1) In the case of Vin>V1

The base-emitter voltages of Q112 and Q113 can be assumed to be equal, so V1 is output at the emitter of Q113.

(2) In the case of Vin<V1

The base-emitter voltages of Q111 and Q113 can be assumed to be equal, so Vin is output at the emitter of Q113.

Q117 and Q118 form a second clip circuit employing a pair of transistors having the same characteristics. The input signal voltage Vin and the second break-point setting voltage V2 (V1<V2) are directly compared and a voltage which is equal to the higher one of the voltages minus the base-emitter voltage of Q117 and Q118 is output at the common emitter B.

Q119 operates as an emitter-follower and a voltage which equals to the voltage input to the base plus the base emitter voltage of Q119 is output at the emitter.

The operation of Q117, Q118 and Q119 in the case of Vin<V2 and in the case of Vin>V2 will now be described.

(1) In the case of Vin<V2

The base-emitter voltages of Q118 and Q119 can be assumed to be approximately equal, so V2 is output at the emitter of Q119.

(2) In the case of Vin>V2

The base-emitter voltages of Q117 and Q119 can be assumed to be approximately equal so Vin is output at the emitter of Q119.

Next, Q116 and R112, and Q122 and R113 form a second current mirror circuit, so the collector current of Q116, i.e., the sum I3+I4 of the second current I3 that flows through the collector of Q114, and the third current I4 that flows through the collector of Q121, and the current I5 that flows through the collector of Q122 are related, from the relations between Vin, V1 and V2, as follows:

(1) In the case of V1<Vin<V2

The base voltage of Q114 and the base voltage of Q115 are both V1 and equal to each other, so $I3 = I0$ The base voltage of Q120 and the base voltage of Q121 are both V2 and equal to each other, so $I4 = I0,$ hence $I5 = 2I0$ (2) In the case of Vin<V1

The base voltage of Q114 is V1, and the base voltage of Q115 is Vin, so $$I3 = I0 + \frac{V1 - Vin}{R111}$$

The base voltage of Q120 and the base voltage of Q121 are both equal to V2, so $I4 = I0$, hence $$I5 = 2\,I0 + \frac{V1 - Vin}{R111}$$

(3) In the case of Vin>V2

The base voltage of Q114 and the base voltage of Q115 are both equal to V1, so $I3 = I0$ The base voltage of Q120 is V2, and the base voltage of Q121 is Vin, so $$I4 = I0 + \frac{Vin - V2}{R114}$$

hence, $$I5 = 2\,I0 + \frac{Vin - V2}{R114}$$

If the current flowing through R118 is denoted by I6, since Q127 and Q128 form a current mirror circuit, $I6 = I2 + I5$ The output signal voltage Vout appearing at the output terminal 107 is given by $$V_{out} = V_{cc} - R118 \cdot I6$$

The output signal voltage Vout is therefore given as follows:

(1) In the case of V1<Vin<V2

$$V_{out} = V_{cc} - R118 \left( I0 + \frac{V_{ref} - V_{in}}{R115} + 2 I0 \right)$$

$$= V_{cc} - R118 \cdot 3 I0 - \frac{R118}{R115} V_{ref} + \frac{R118}{R115} V_{in}$$

(2) In the case of Vin<V1

$$V_{out} = V_{cc} - R118 \left( I0 + \frac{V_{ref} - V_{in}}{R115} + 2 I0 + \frac{V1 - V_{in}}{R111} \right)$$

$$= V_{cc} - R118 \cdot 3 I0 - \frac{R118}{R115} V_{ref} - \frac{R118}{R111} V1 + \left( \frac{R118}{R115} + \frac{R118}{R111} \right) V_{in}$$

(3) In the case of Vin<V2

$$V_{out} = V_{cc} - R118 \left( I0 + \frac{V_{ref} - V_{in}}{R115} + 2 I0 + \frac{V_{in} - V2}{R114} \right)$$

$$= V_{cc} - R118 \cdot 3 I0 - \frac{R118}{R115} V_{ref} + \frac{R118}{R114} V2 + \left( \frac{R118}{R115} - \frac{R118}{R114} \right) V_{in}$$

The first break-point setting voltage V1 and the second break-point setting voltage V2 are obtained by voltage-dividing the difference between Vref and Vcc by the use of R119, R120 and R121. That is, $$V1 = V_{ref} + \frac{R119}{R119 + R120 + R121} (V_{cc} - V_{ref})$$

$$V2 = V_{ref} + \frac{R120 + R121}{R119 + R120 + R121} (V_{cc} - V_{ref})$$

Figure 5:
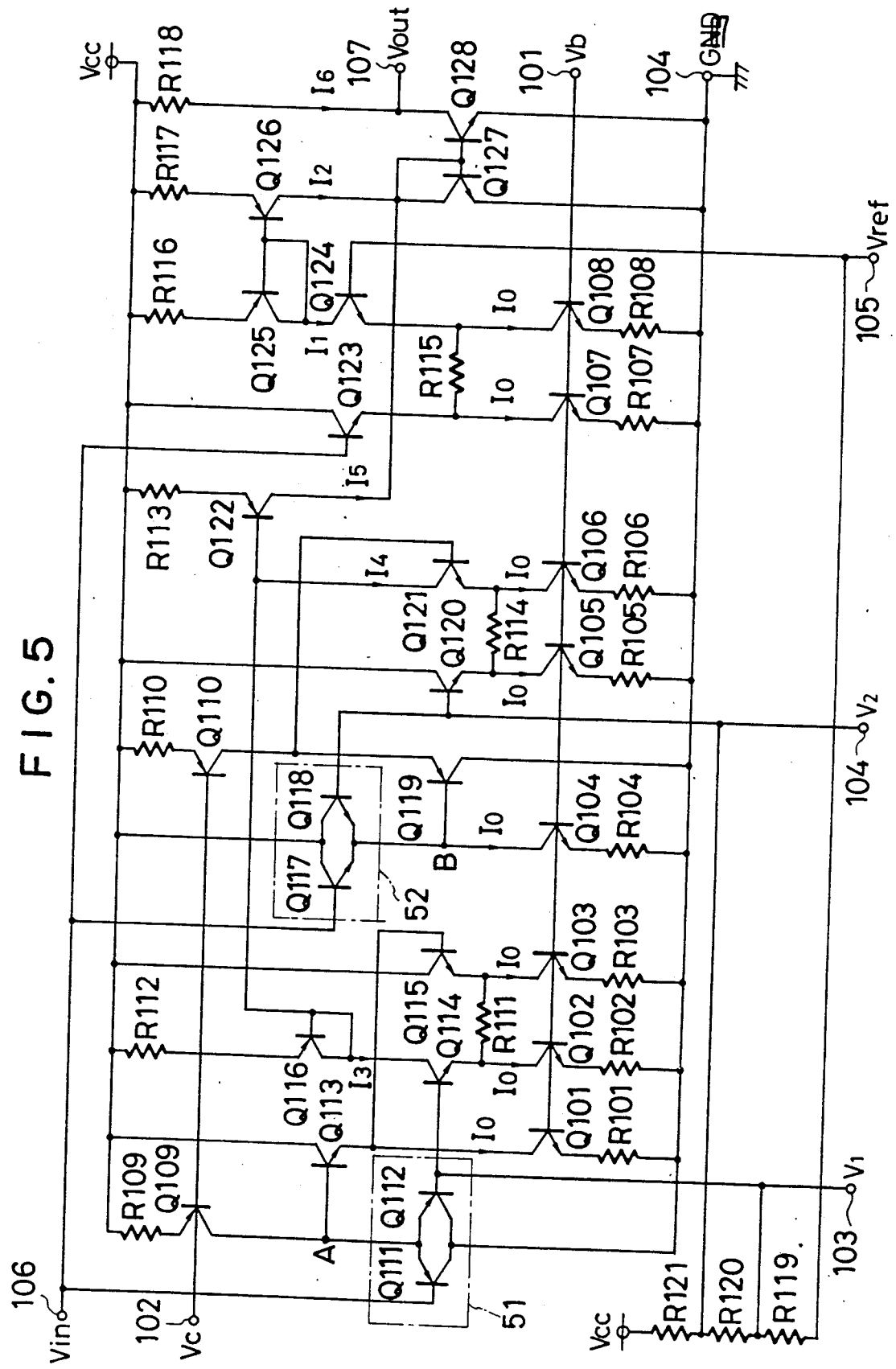
FIG. 5 is a diagram showing another embodiment of the polygon circuit according to the invention.
Figure 6:
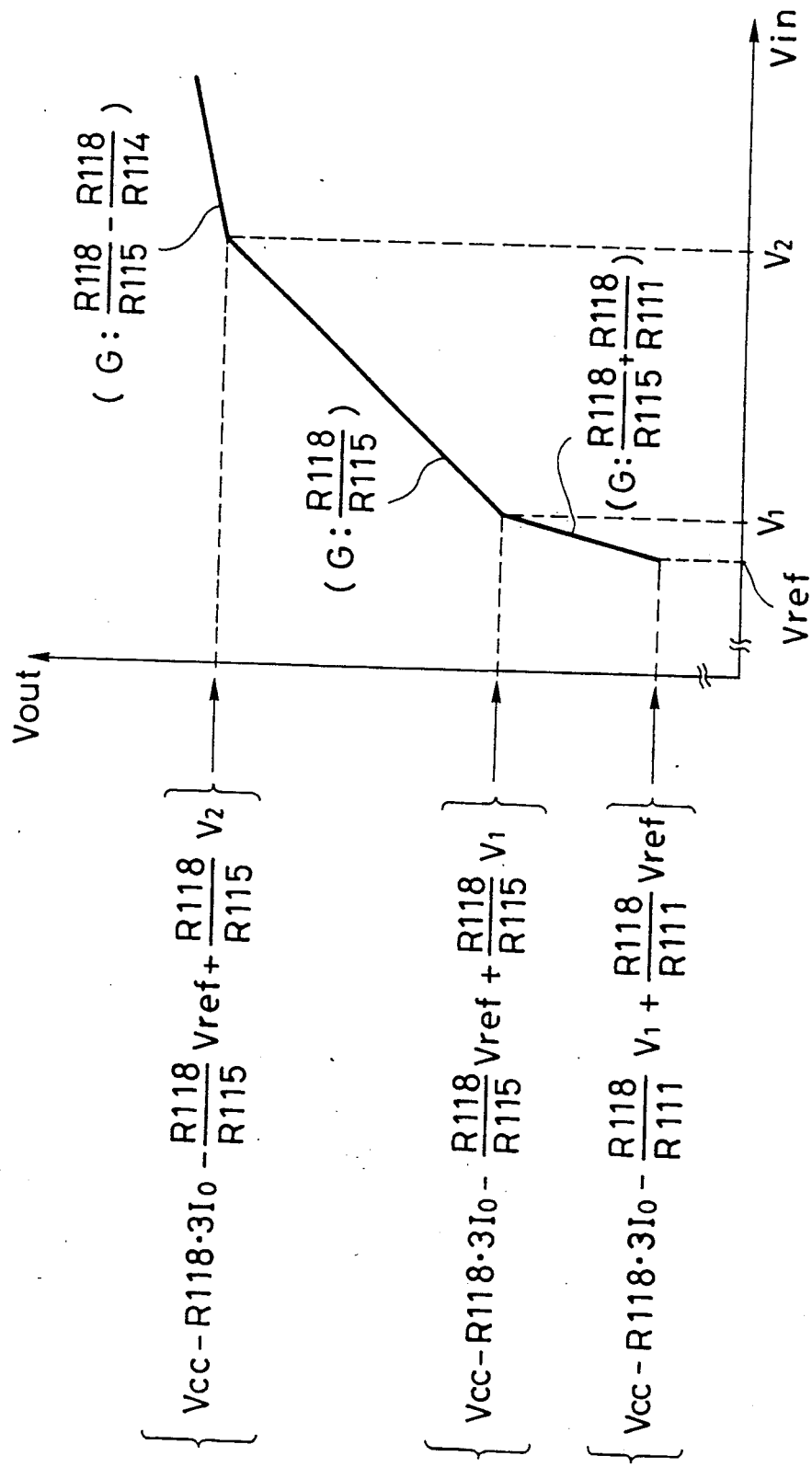
FIG. 6 is a diagram showing input/output characteristics of the polygon circuit of Fig. 5.

Through the operation described above, the input/output characteristics of the embodiment shown in FIG. 5 is as shown in FIG. 6.

The gradient G of the input/output characteristics in the case of Vin<V2 is $$\frac{R118}{R115} + \frac{R118}{R111}$$

The gradient G of the input/output characteristics in the case of Vin<V1 is $$\frac{R118}{R115}$$

The gradient G of the input/output characteristics in the case of Vin>V2 is $$\frac{R118}{R115} - \frac{R118}{R114}$$

Thus, according to this embodiment, the position of the break-point BP with respect to the input signal voltage Vin is obtained by directly comparing the voltages Vin with V1 and V2, so even if the current source current setting voltage Vb fluctuates, the fluctuation in the break-point BP is reduced.

The part in the range of V1<Vin<V2 which forms the main part of the video signal and the part in the range of Vin<V1 and the part in the range of Vin>V2 are processed by separate circuits, so the current values can be determined independently to acquire the frequency characteristics, dynamic range, and the like.

Moreover, the difference between the reference voltage Vref and the power supply voltage Vcc is voltage-divided to produce the break-point setting voltage V1 and V2, so V1 and V2 fluctuates following fluctuation in Vref, and hence adverse effects due to fluctuation in Vref can be alleviated, although this feature is not indispensable.

In the above embodiment, two break-points BP are provided, but the number of the break-points can be other than two.

As has been described, according to the above embodiment, the input signal voltage and a plurality of break-point setting voltage are directly compared to determine the polygon characteristics, so it is possible to obtain an polygon circuit in which fluctuation in the break-point with respect to the reference level is reduced.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A polygon circuit comprising:
   means for producing a first current proportional to the difference between an input signal voltage Vin and a reference voltage Vref;
   a clip circuit for clipping said input signal voltage Vin at a break-point setting voltage Va;
   means for producing a second current proportional to the difference between the output voltage of said clip circuit and said break-point setting voltage; and
   means for performing addition or subtraction on said first current and said second current to output a voltage signal proportional to the sum or the difference.

2. An polygon circuit comprising:
   means for producing a first current proportional to the difference between an input signal voltage and a reference voltage;
   a first clip circuit for clipping said input signal voltage at a first break-point setting voltage;
   means for obtaining a second current proportional to the difference between the output voltage of said first clip circuit and said first break-point setting voltage;
   a second clip circuit for clipping said input signal voltage at a second break-point setting voltage;
   means for obtaining a third current proportional to the difference between the output voltage of said second clip circuit and said second break-point setting voltage;
   first summing/differentiating means for performing addition or subtraction between said second current and said third current;

second summing/differentiating means for performing addition or subtraction between the output current of said first summing/differentiating means and said first current; and means for outputting a signal voltage proportional to the output current of said second summing/differentiating means.

* * * * *